US 6,683,421 B1

(12) United States Patent
Kennedy et al.

(10) Patent No.: US 6,683,421 B1
(45) Date of Patent: Jan. 27, 2004

(54) ADDRESSABLE SEMICONDUCTOR ARRAY LIGHT SOURCE FOR LOCALIZED RADIATION DELIVERY

(75) Inventors: John Kennedy, Guelph (CA); Jim Farrell, Etobicoke (CA); Manfred Hubert, Don Mills (CA); Roy Kayser, Etobicoke (CA); Eduardo Ghelman, Etobicoke (CA)

(73) Assignee: EXFO Photonic Solutions Inc., Mississauga (CA)

(*) Notice: Subject to any disclaimer, the term of this patent is extended or adjusted under 35 U.S.C. 154(b) by 52 days.

(21) Appl. No.: 09/769,266

(22) Filed: Jan. 26, 2001

(30) Foreign Application Priority Data

Jan. 25, 2001 (CA) ............................................. 2332190

(51) Int. Cl.[7] ................................................. G02B 6/04
(52) U.S. Cl. ........................ 315/291; 315/149; 362/552; 362/555
(58) Field of Search ................................ 315/291, 307, 315/149; 362/552, 555, 553, 554, 558

(56) References Cited

U.S. PATENT DOCUMENTS

| | | | |
|---|---|---|---|
| 4,156,626 A | | 5/1979 | Souder |
| 4,680,644 A | * | 7/1987 | Shirato et al. ............ 250/208.1 |
| 4,754,166 A | * | 6/1988 | Nagano ....................... 326/100 |
| 4,931,782 A | | 6/1990 | Jackson |
| 5,068,714 A | | 11/1991 | Seipler |
| 5,356,947 A | | 10/1994 | Ali et al. |
| 5,362,671 A | | 11/1994 | Zavracky et al. |
| 5,366,573 A | | 11/1994 | Bayer et al. |
| 5,517,151 A | * | 5/1996 | Kubota ......................... 250/206 |
| 5,605,595 A | | 2/1997 | Beetson et al. |
| 5,637,175 A | | 6/1997 | Feygin et al. |
| 5,736,881 A | * | 4/1998 | Ortiz ............................ 323/269 |
| 5,955,021 A | | 9/1999 | Tiffany, III |
| 6,025,054 A | | 2/2000 | Tiffany, III |
| 6,039,830 A | | 3/2000 | Park et al. |
| 6,078,379 A | | 6/2000 | Nagae et al. |
| 6,290,382 B1 | * | 9/2001 | Bourn et al. ................. 362/294 |

* cited by examiner

*Primary Examiner*—David Vu
(74) *Attorney, Agent, or Firm*—Bereskin & Parr

(57) ABSTRACT

A photocuring device and a method of photocuring using it. The device includes a housing and a light emitting semiconductor array mounted to the housing, capable of emitting light energy having a light output wavelength suitable for initiating a photoreaction. The device also has a power source for providing power to energize the array to emit light energy and a controller coupled to the power source for varying the power provided by the power source to the array.

34 Claims, 15 Drawing Sheets

ADDRESSABLE SEMICONDUCTOR ARRAY LIGHT SOURCE FOR LOCALIZED RADIATION DELIVERY

FIELD OF THE INVENTION

The present invention relates to the field of radiation delivery systems, including photocuring systems.

BACKGROUND OF THE INVENTION

The utilization of photopolymerized materials, adhesives and encapsulants in industrial manufacturing applications has increased dramatically in the past decade. For the most part, this has been a result of the advances in photochemistry.

Correspondingly, light source technology has evolved utilizing medium pressure linear ultraviolet (UV) lamps, microwave powered UV lamps, xenon lamps and high-pressure mercury vapour and metal halide lamps. These lamps provide photons in the absorption bandwidth of the photo-initiators utilized in the chemistry required to complete the photochemical reaction.

In general, the available old lamp technology required to provide the energizing photons operates with an efficiency of 1–10% in order to provide broadband energy between 248 nanometres (nm) to 500 nm in wavelength required for the photochemical reaction. Typically these lamps require a warm up time to reach full output power, cannot be turned off and on rapidly, generate a great deal of electromagnetic interference (EMI) necessitating extensive shielding, require venting for ozone produced and often contain mercury, an environmentally hazardous substance. Other commonly used light technologies have a limited lifetime (greater than 1,000 hours) with continuous degradation over time.

There is accordingly a need for apparatus which efficiently emits light energy suitable for initiating a photoreaction.

SUMMARY OF THE INVENTION

The present invention is directed towards a light curing device, which has common, but by no means exclusive application to industrial manufacturing applications involving photoreactive materials. When used herein, it should be understood that "curing", "photocuring" and "photoreaction" are intended to include the concepts of "thermal curing", "polymerizing" and "photoinitiating", each of which terms (and variations thereof) may be used interchangeably herein.

The device according to the present invention includes a housing and a light emitting semiconductor array mounted to the housing, capable of emitting light energy having a light output wavelength suitable for initiating a photoreaction. The device also has a power source for providing power to energize the array to emit light energy and a controller coupled to the power source for varying the power provided by the power source to the array.

The invention is also directed towards the use of the present photocuring device invention described above to cure photoreactive materials. Similarly, the invention is directed towards a method of curing photoreactive products using the photocuring device invention. The method comprises the steps of:

A. providing a light curing device of the present invention;

B. positioning a photoreactive product proximate the light curing device; and

C. causing the device to emit light energy suitable for initiating a photoreaction onto the product until the product is sufficiently photocured.

BRIEF DESCRIPTION OF THE DRAWINGS

The present invention will now be described, by way of example only, with reference to the following drawings, in which like reference numerals refer to like parts and in which.

DETAILED DESCRIPTION OF THE PREFERRED EMBODIMENT

Figure 1A:
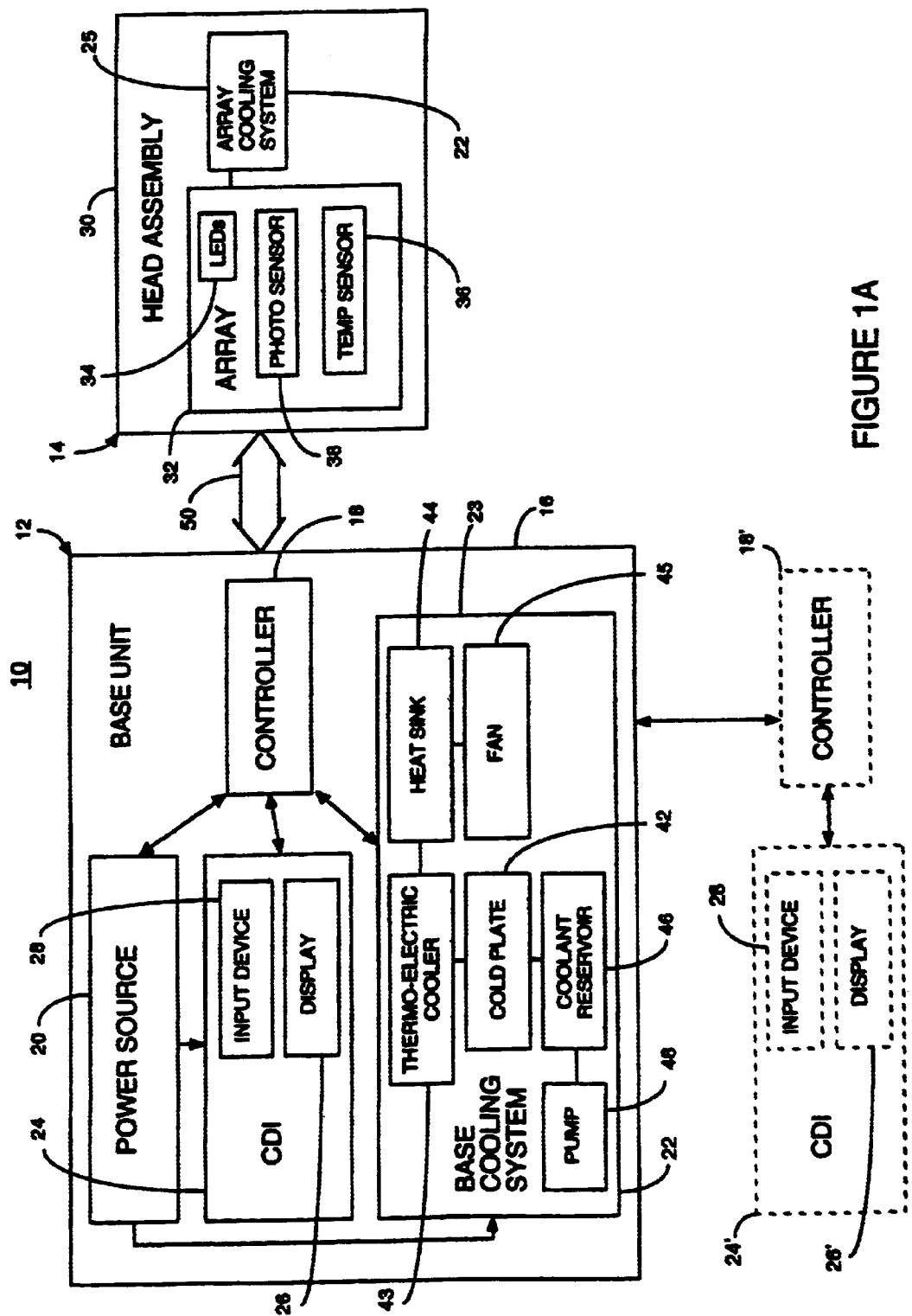
FIG. 1A is a schematic diagram of a photocuring device made in accordance with the present invention.

Referring to FIG. 1A, illustrated therein is a first embodiment of the subject invention. The photocuring device, shown generally as 10, typically comprises a base unit 12 and a remote LED array head assembly 14 operationally coupled to the base unit 12.

The base unit 12 typically includes a base unit housing 16 which may contain a controller 18 (typically a suitably programmed CPU (central processing unit) having RAM (random access memory) and ROM (read only memory) operationally connected to a power source 20. Preferably, the device 10 also has a cooling system 22 and a control data interface 24 operatively coupled to the controller 18 which displays operational data to the user on a display 26, and which receives input control instructions via an input device 28 from the user to the controller 18 which controls the operation of the device 10.

Alternatively, as will be understood, the controller 18, control data interface 24, input device 28 and display 26 may be replaced with similar components (controller 18', control data interface 24', input device 28' and display 26') operatively coupled to, but remote from, the base unit 12.

The head assembly 14 includes a head assembly housing 30 holding an array 32 of LED die 34. Preferably, the assembly 14 also comprises a temperature sensor 36 for detecting the operating temperature of the array 32, as well as a photo, photodiode or optical sensor 38 for detecting the levels of light energy generated by the array 32.

Typically, the power source 20 will be adapted to provide regulated current to the LEDs during operation, using pulse width modulation to control the radiance of the LEDs (as controlled by the controller 18).

The cooling system 22 includes base unit 12 cooling system components 23 and array head assembly 14 cooling system components 25. The head assembly 14 is operatively coupled to the base unit 12 through flexible connectors 50 which include tubing for circulating liquid coolant between base unit cooling system 23 and the array head cooling system 25, as will be described in greater detail below. The connectors 50 also include electrical cabling to supply power to the array 32, as well as to conduct data signals from the sensors 36, 38 to the controller 18. Preferably the head assembly 14 and the connectors 50 are designed such that the assembly 14 may be operatively coupled and decoupled from the base unit 12, to enable the assembly 14 to be replaced, or exchanged with an assembly having an alternate configuration.

Figure 1B:
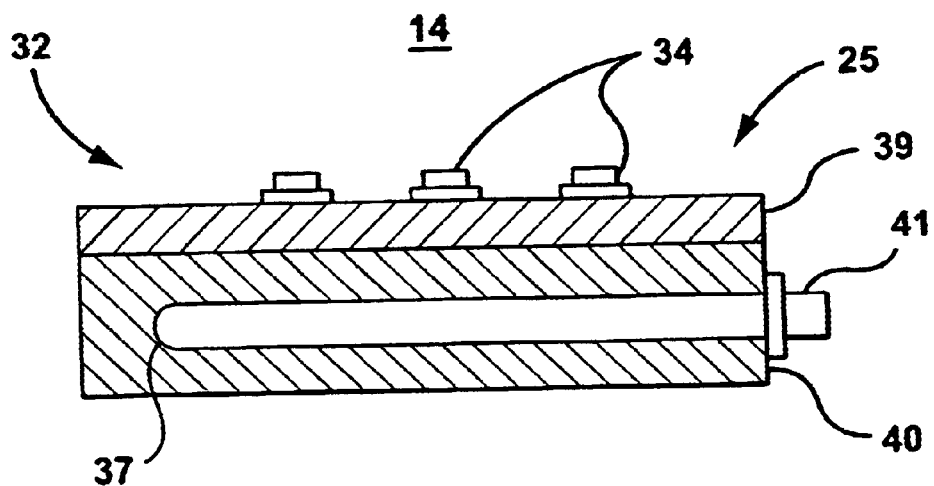
FIG. 1B is a side schematic diagram of the array head cooling system of FIG. 1A.

FIG. 1B illustrates a side view of the array head assembly 14 cooling system components 25. The head cooling system 25 typically includes a liquid cooled cold plate 40 mounted behind the LED array 32, for absorbing heat generated by the LED die 34 when in operation. The LED die 34 are mounted on a thermally conductive substrate 39, typically ceramic, to spread and conduct heat to the cold plate 40. The cooling system 25 also has an inlet 41 for receiving liquid coolant from the base unit cooling system 23. The coolant travels through a circulatory channel 37 passing through the cold plate 40 to an outlet (not shown).

Figure 1C:
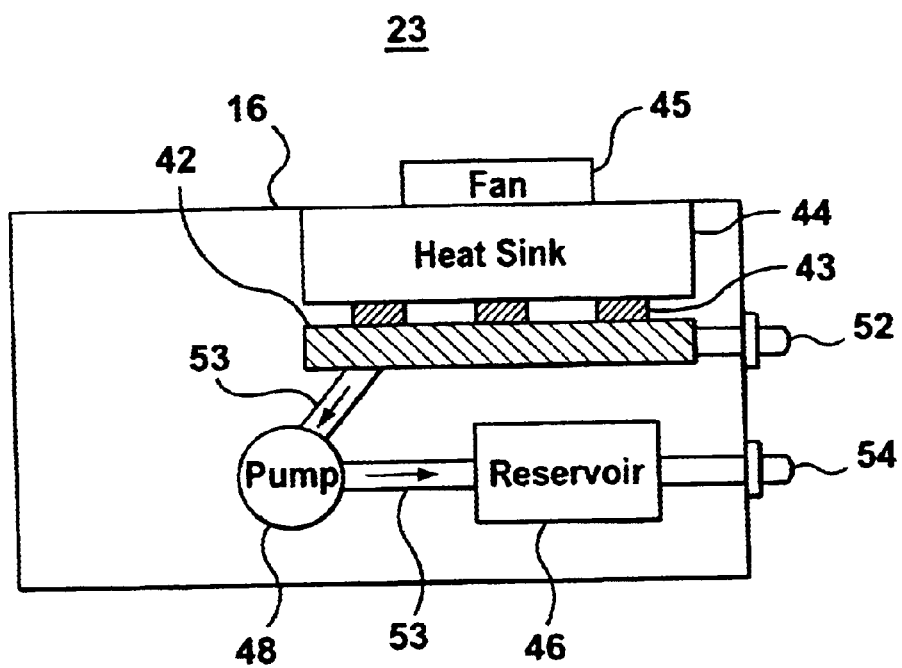
FIG. 1C is a schematic diagram of the base unit cooling system of FIG. 1A.

FIG. 1C illustrates a side schematic view of the various base unit cooling system 23 components. The base unit cooling system 23 preferably includes a cold plate 42, a thermo electric cooler 43, as well as a heat sink 44, a fan 45 and a liquid reservoir 46 for storing the liquid coolant. A pump 48 is also provided for circulating the coolant throughout the cooling system 22. As will be understood, the base unit cooling system 23 has an inlet 52 for receiving heated coolant from the array head assembly 14 cooling system 25. The heated coolant travels through a circulatory channel 53 passing through the cold plate 42. The heat stored in the coolant is transferred to the cold plate 42, which in turn conducts the heat energy to the thermo electric cooler 43. The heat energy is transferred to the heat sink 44. The fan 45 is preferably located proximate an exterior wall of the base unit housing 16, to draw external air across the heat sink 44 thereby increasing its cooling efficiency. The cooled coolant is then directed by the pump 48 to the reservoir 46. Coolant may then be circulated through the outlet 54 to the array head assembly 14 cooling system 25 through the connectors 50.

Figure 1D:
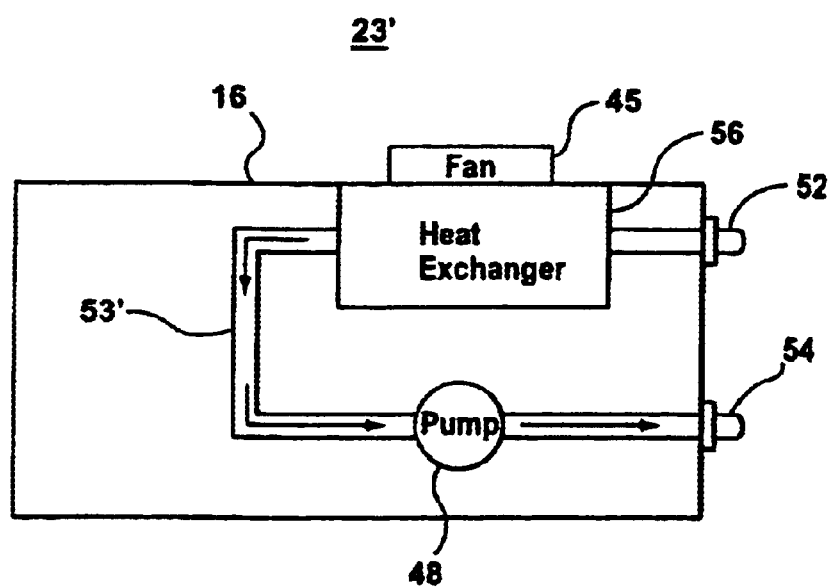
FIG. 1D is a schematic diagram of an alternate configuration of a base unit cooling system.

Referring now to FIG. 1D, illustrated therein is a schematic diagram of an alternate configuration of a base unit cooling system 23'. In place of the heat sink 44, the thermo electric cooler 43 and the cold plate 42 of the cooling system 23 illustrated in FIG. 1C, the alternate cooling system 23' utilizes a heat exchanger 56 positioned proximate a fan 45 near an external wall of the base unit housing 16. Heated liquid coolant is received through the inlet 52, and is circulated by a pump 48 through a circulatory channel 53' passing through the heat exchanger 56, before it exits through the outlet 54.

Figure 1E:
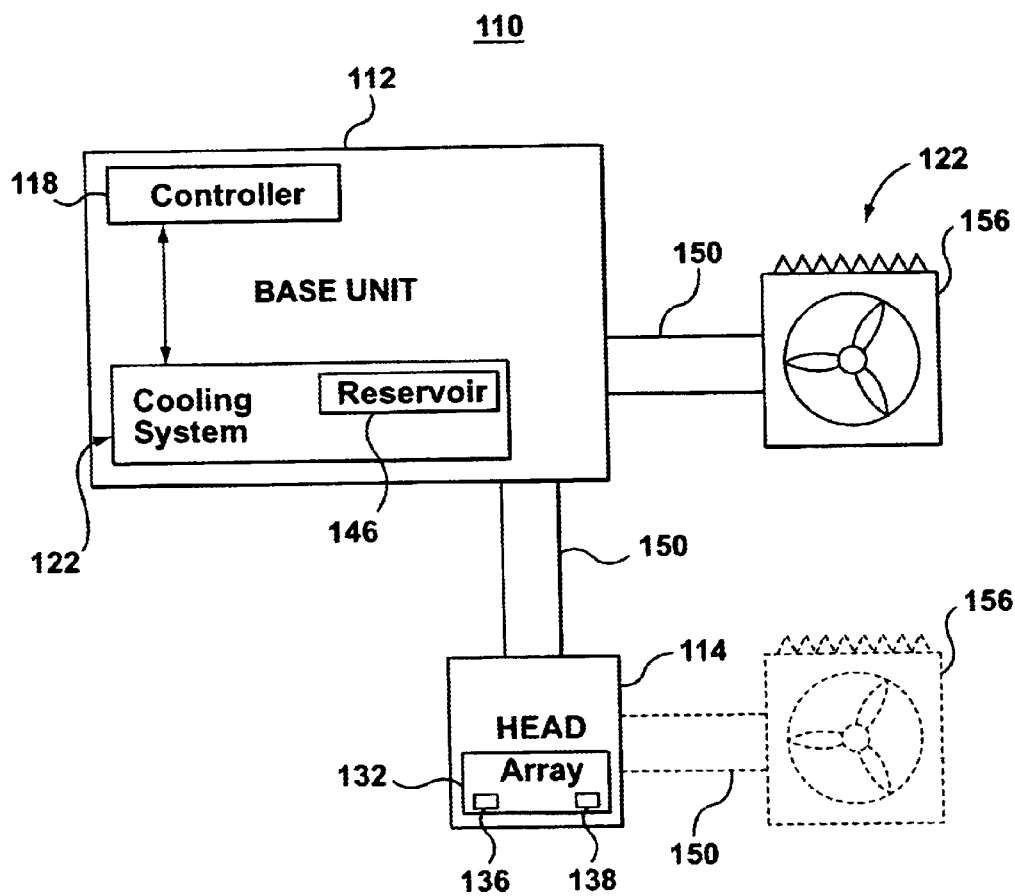
FIG. 1E is a schematic diagram of an alternate configuration of a photocuring device made in accordance with the present invention, having a different cooling system than the device of FIG. 1A.

A further alternate configuration of the cooling system 122 is illustrated in FIG. 1E. The device 110 is generally similar to the device 10 illustrated in FIG. 1A. In place of the heat sink 44, the thermoelectric cooler 43 and the cold plate 42 illustrated in FIG. 1A, the alternate cooling system 122 may include a heat exchanger 156 external to the base unit 112, coupled to a coolant reservoir 146 and pump (not shown). Connectors 150 (connecting the head assembly 114 and heat exchanger 156 to the base unit 112) provide tubular conduits for the circulation of liquid coolant, and also electrical cabling to supply power to the array 132 in the head assembly 114 (generally similar to head assembly 14) and the heat exchanger 156. Connectors 150 also conduct data signals from the photo sensors 136 and temperature sensors 138 to the controller 118 (generally similar to controller 18). Instead of being coupled directly to the base unit 112, alternatively, a heat exchanger 156' may be directly coupled to the head assembly 114, as will be understood.

While LEDs typically provide relatively stable radiance output, some degradation occurs over time. Referring back to FIG. 1A, the photo sensor 38 will preferably comprise semi-conductor photodiodes, and will provide continuous monitoring of the light energy output of the array 32, to enable the system 10 to provide measurable quantities of light energy, providing a high level of confidence that the required light energy has been delivered to the workpiece. Irradiation control is important when photocuring products and materials having narrow tolerance levels, such as bonding photonic components including solid state lasers and single mode fibers.

Figure 1F:
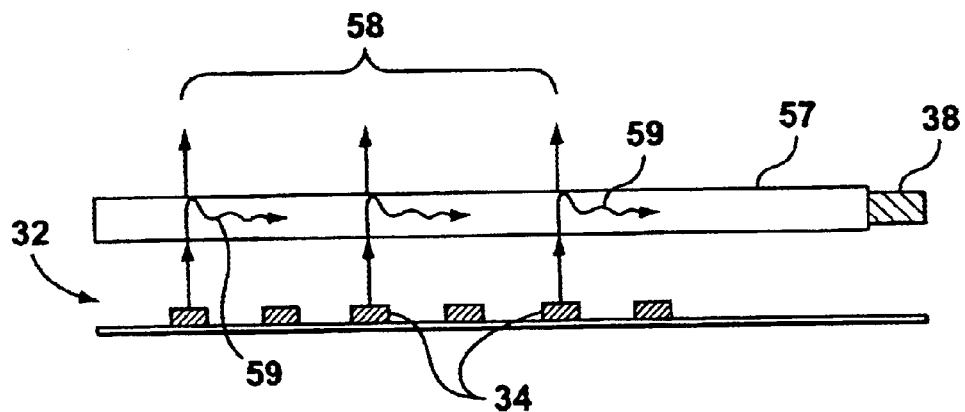
FIG. 1F is a side view schematic diagram of a photo sensor configuration of FIG. 1A.

Referring now to FIG. 1F, illustrated therein is a side schematic view of a photo sensor 38 arrangement. The array 32 of LED die 34 should preferably be protected. An output window 57 may be positioned above the LED die 34, thereby providing some protection to the LED die 34. Preferably the output window 57 is made of clear plastic or other material which has been selected such that the majority of light energy (preferably at least 90%) emitted by the LED die 34 (as indicated by light vectors 58) passes directly through the output window, with a small percentage of the light energy (typically less than 10%) being internally reflected within the output window 57 (as indicated by light vectors 59).

Preferably, a photo sensor 38 will be positioned and configured to measure light 59 which is internally reflected within the output window 57 of the array 32. The light which is reflected internally can be measured by the photo sensor 38, which may include photodiodes. Such a configuration minimizes or prevents light energy reflected from the workpiece or from external sources from being detected by the photo sensor 38 and affecting the accuracy of the readings. As a result, the reflectivity of the workpiece or the proximity of the workpiece to the array 32 will have a reduced impact on the accuracy of the data generated by the photo sensor 38. As will be understood, a series of photo sensors 38 positioned around the perimeter of the output window 57 of the array 32 will detect any changes in average optical power.

Figure 1G:
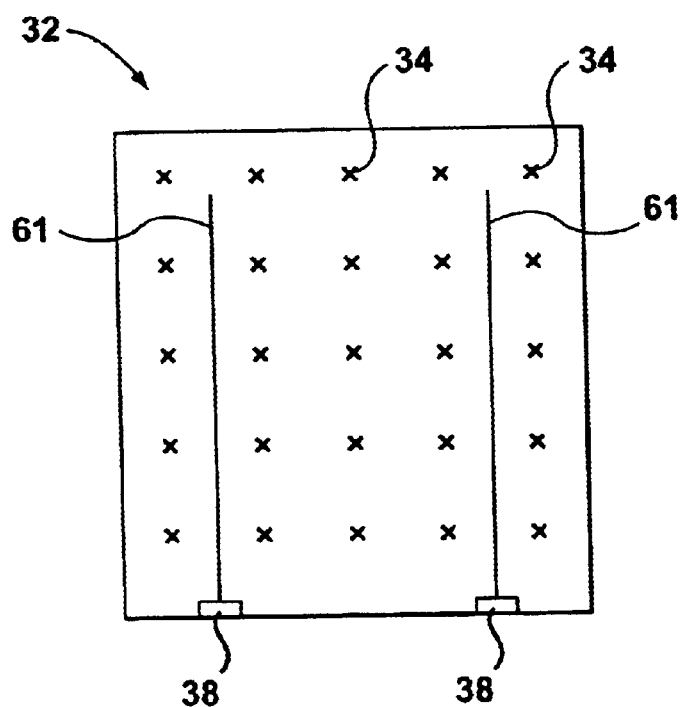
FIG. 1G is a top view schematic diagram of an alternate photo sensor configuration than in FIG. 1F.

A top schematic diagram of an alternate photo sensor configuration is illustrated in FIG. 1G. Optical fibers 61 may be positioned between the LED die 34 in the array 32. Preferably, the optical fibers 61 will be made of material which is able to receive sidewall light emissions from the LED die 34, and direct the received light energy (through internal reflection) toward photo sensors 38, such as photodiodes.

Figure 2A:
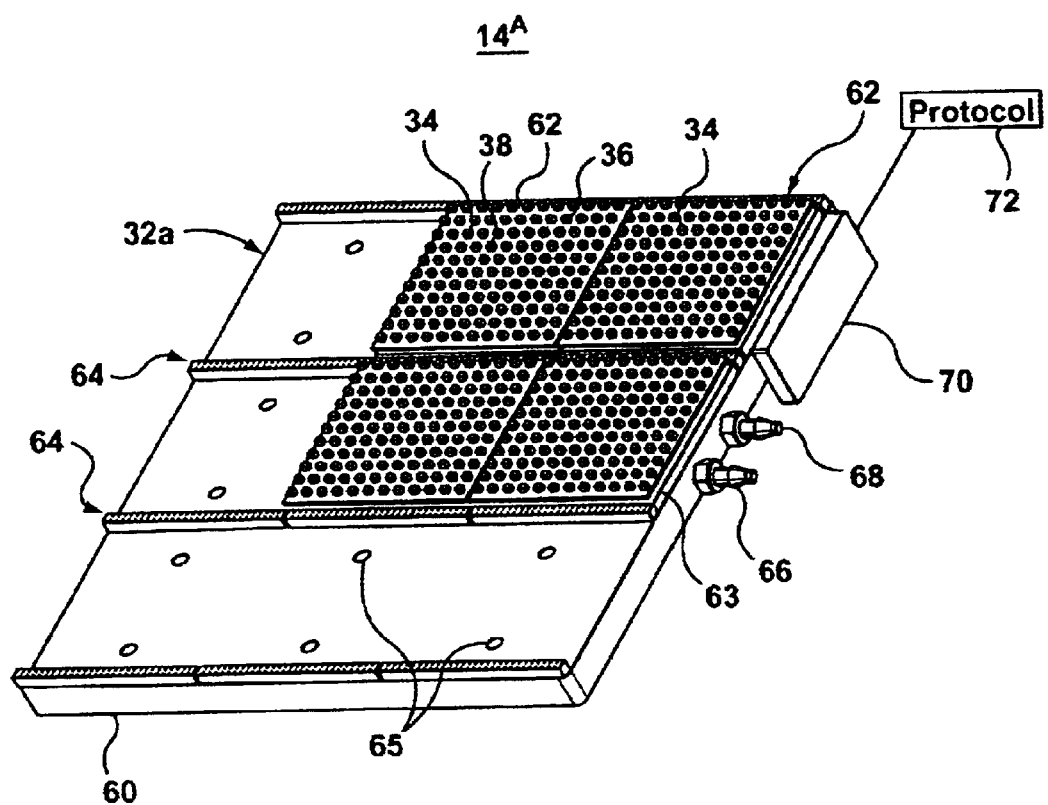
FIG. 2A is a perspective view of a first alternative embodiment of a modular LED (light emitting diode) array head assembly.

Referring now to FIG. 2A, illustrated therein is a first alternative embodiment of a modular array head assembly 14$^A$, with some of the LED die 34 removed for illustrative purposes. The assembly 14$^A$ comprises a platform 60 designed to operatively engage a plurality of array modules 62 which collectively form an array 32$^A$. Each module 62 is typically square or rectangular and comprises an array of LED die 34 and sensors 36, 38, mounted onto a printed board substrate, as will be understood by one skilled in the art. The modules 62 are typically formed of thick film or plated metal circuitry on an electrically insulating substrate, such as a ceramic alumina. Alternatively, the circuit can be printed directly onto a metal substrate. Preferably, the substrate will in turn be mounted onto a metal heat sink 63. The platform 60 also comprises array connectors 64 for electronically and physically engaging the array modules 62.

The platform 60 also preferably includes locating holes 65, designed to receive locating pegs positioned on the back of the modules 62, for accurately positioning the modules 62 on the platform 60.

The platform 60 also includes a liquid coolant inlet 66 and a liquid coolant outlet 68 for releasably engaging the connectors 50. Typically, the base of the platform 60 will be a liquid cooled cold plate formed of metal or other heat conductive material, having a circulatory path for the coolant commencing at the inlet 66 and passing beneath the various array modules 62 and ending at the outlet 68. Preferably, the heat sink 63 is mounted to the cold plate to assist in transferring the heat generated by the LED die 34 to the cold plate. The platform 60 also has an input connector 70 adapted to releasably engage the electrical cabling portion of the connectors 50, to provide an electrical connection between the controller 18 (and power source 20) and the modules 62. The input connector 70 preferably comprises a communications protocol chip 72 for coordinating the communication of the data generated by the sensors 36, 38 to the controller 18 (illustrated in FIG. 1A).

Figure 2B:
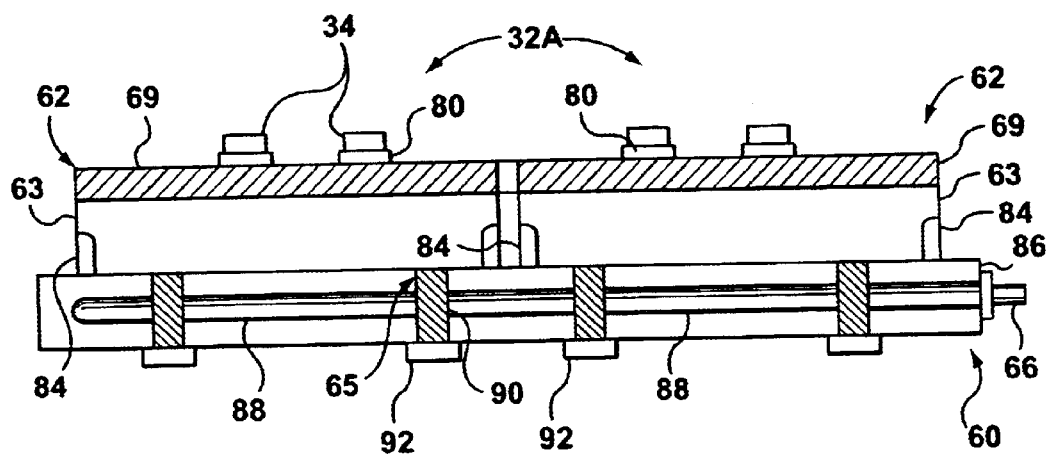
FIG. 2B is a side schematic view of the modular LED array head assembly of FIG. 2A.

FIG. 2B illustrates a side schematic representation of the modular array head assembly 14$^A$ substantially illustrated in FIG. 2A. As described in relation to FIG. 2A, modules 62 comprise an array of LED die 34 (collectively forming an array 32$^A$) mounted on the plated metal or thick film circuitry 80 of a ceramic alumina circuit board 69. In turn, the circuit board 69 is mounted to a metal heat sink 63. The module 62 also includes electrical connectors 84, to electrically engage the platform's 60 array connectors 64 (illustrated in FIG. 2A), and provide power to the circuit board 69. A liquid cooled cold plate 86 is provided at the base of the platform 60. Liquid coolant circulates throughout the cold plate 86 through a circulatory channel 88 commencing at the inlet port 66 and exiting at the outlet port 68 (illustrated in FIG. 2A). The platform 60 also preferably includes locating holes 65 passing through the cold plate 86, designed to engage locating pegs 90 mounted to the base of the module 62. The pegs 90 are fixed to the platform 60 through the use of removable fasteners 92 to provide close physical contact between the cold plate 86 and the heat sink 63. With the fasteners 92 removed, the modules 62 can in turn be removed from the platform 60.

As should be understood, by making the array modules 62 square or rectangular, the overall size of the array 32 is scalable, since the platform 60 may be designed to accommodate multiple LED modules 62, each of which can abut another module 62 on each of its four sides. Large area planar light sources can thus be constructed using these LED module 62 building blocks. Another advantage of this configuration is that modules 62 can be individually replaced, if desirable, as a result of damage or long use.

Preferably, each module 62 comprises a series of current limiting resistors, to equalize current through each module 62. Additionally, preferably the array connectors 64 (and the modules 62) are wired in a series-parallel configuration, as will be understood by one skilled in the art.

Figure 2C:
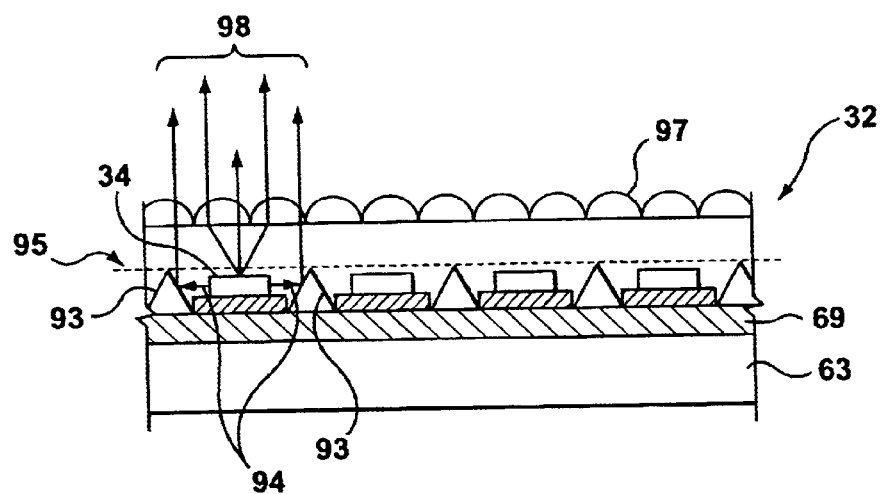
FIG. 2C is a side schematic view of a microlens configuration for an LED array head assembly.

As illustrated in FIG. 2C, preferably, the array 32 also incorporates a grid 93 of reflectors or refractors which direct any sidewall emission of light (illustrated by light vectors 94) from each LED die 34 towards the workpiece to be cured. The LED array 32 also preferably incorporates a conformal coating 95 with a refractive index between that of the LED material and air to increase the coupling of light from the LED die 34. Additionally the array 32 also preferably incorporates a microlens array 97 positioned between the LED die 34 and the workpiece, configured to collimate the emitted light (illustrated by light vectors 98). The microlens array 97 also serves to protect the LED die 34 from contact.

As should be understood, LEDs typically have a long operational life and provide a steady output intensity level over the operational life of the LED. However, LEDs do degrade slowly over time. Referring back to FIG. 1A generally, the photo sensor 38 will preferably comprise semi-conductor photodiodes, and will provide continuous monitoring of the light energy output of the array 32, to enable the system 10 to provide measurable quantities of light energy, providing a high level of confidence that the required light energy has been delivered to the workpiece. Irradiation control is important when photocuring products and materials having narrow tolerance levels, such as bonding photonic components including solid state lasers and single mode fibers.

As should also be understood, the miniature size of the LED die 34 (approx 10×10 mil) permit array densities up to 4,000 LED die per square inch which can provide a significant quantity of energy and homogeneity of output light energy.

As an alternative to LEDs, organic LEDs (such as organic planar light devices) or any other semi-conductor light source can be used such as laser diodes and vertical cavity emitting lasers. As well, the LEDs may be selected such that they emit light energy in the infrared or near infrared range for heat curing applications.

As will be understood by one skilled in the art, the controller 18 is preferably programmed to receive data from the control data interface 24 corresponding to user requirements for light output power (irradiance), exposure time (or multiple exposure times), and on/off rates of the array 32 and variation of irradiance throughout an exposure cycle. The controller 18, periodically monitors the feedback data generated by the photo sensor 38, then controls the power supplied to the array 32 to generate the required light energy output.

Similarly, one or more thermal sensors 36 are preferably placed proximate or within the array 32 to generate and forward temperature data to the controller 18 to control the cooling system 22 or to terminate the supply of power to the array 32 to ensure that the LED die 34 are operating within the manufacturer's recommended temperature range.

Depending on the absorption characteristics of the material to be photoinitiated, all of the LED die 34 or other light emitting devices in the array 32 may be selected to emit light energy having substantially the same peak wavelength. Alternatively, the LED die 34 or other light emitting devices in the array 32 may be arranged in groups such that each LED die 34 or other light emitting device emits light energy having substantially the same peak wavelength as every other LED die 34 or other light emitting device in its group, but different from the output wavelength of the LEDs or light emitting devices in a different group. Alternatively, multiple wavelength diodes can be spread randomly over the array to generate a light source with a broader bandwidth. Groups may comprise complete modules 62 (as illustrated in FIG. 2A), depending on the size of the array 32. As well, the controller 18 is preferably programmed to direct different quantities of power to each group, possibly at different times and for different durations, in accordance with the curing requirements of the workpiece.

Figure 2D:
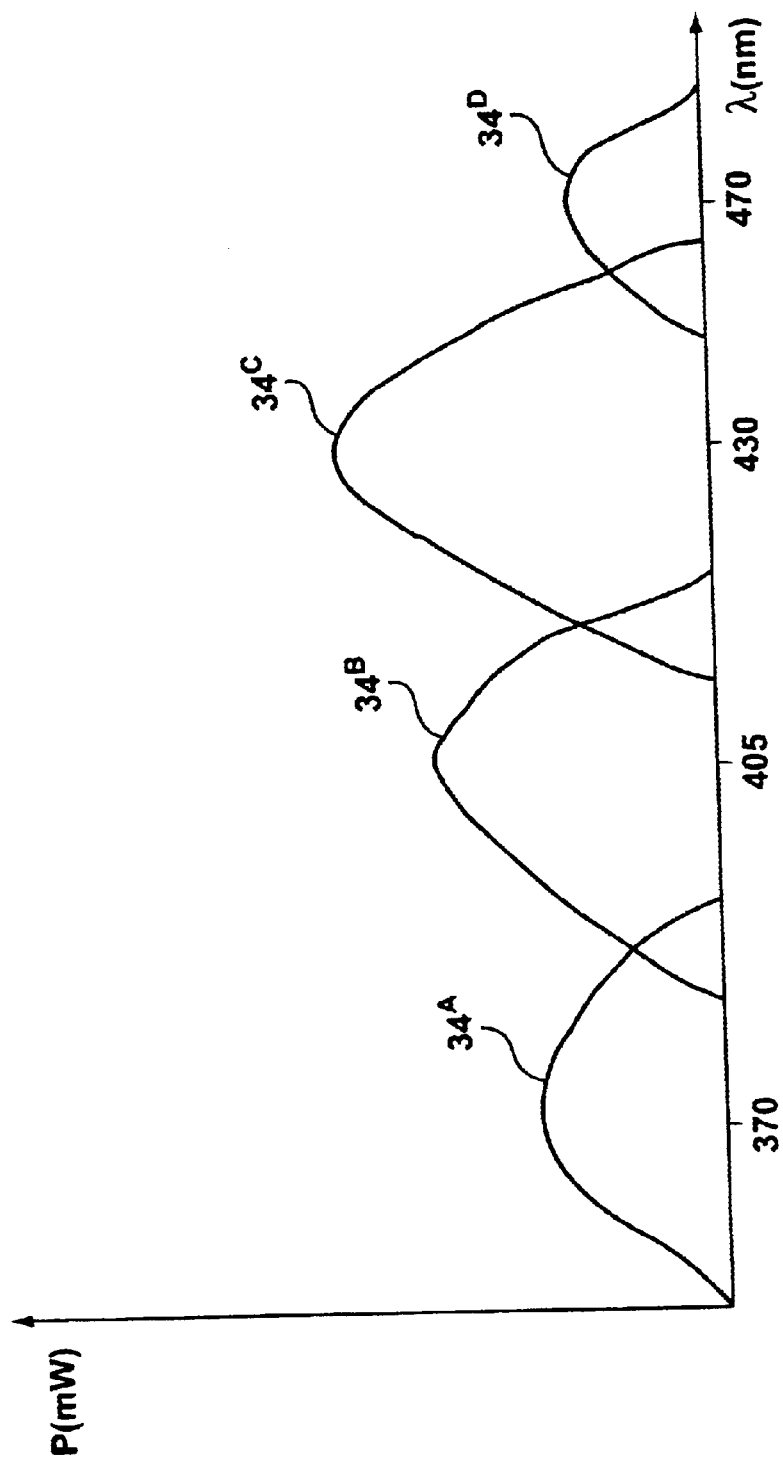
FIG. 2D is a chart indicating the light energy output of LED die having different peak output wavelengths.

Referring now to FIG. 2D, illustrated therein is a chart indicating the light energy output of four different types of LED die, each having different peak output wavelengths. The vertical axis represents the output power of the LED die in milliwatts (mW), while the horizontal axis represents the wavelength of the light energy emitted by the LED die in nanometers (nm). The first type of LED die emit light over a range of wavelengths $34^A$ (as illustrated by the first roughly parabolic curve on the chart) and have a peak output wavelength of approximately 370 nm. The second type of LED die emit light over a range of wavelengths $34^B$ (as illustrated by the second roughly parabolic curve on the chart) and have a peak output wavelength of approximately 405 nm. The third type of LED die emit light over a range of wavelengths $34^C$ (as illustrated by the third roughly parabolic curve on the chart) and have a peak output wavelength of approximately 430 nm. The fourth type of LED die emit light over a range of wavelengths $34^D$ (as illustrated by the fourth roughly parabolic curve on the chart) and have a peak output wavelength of approximately 470 nm.

Figure 2E:
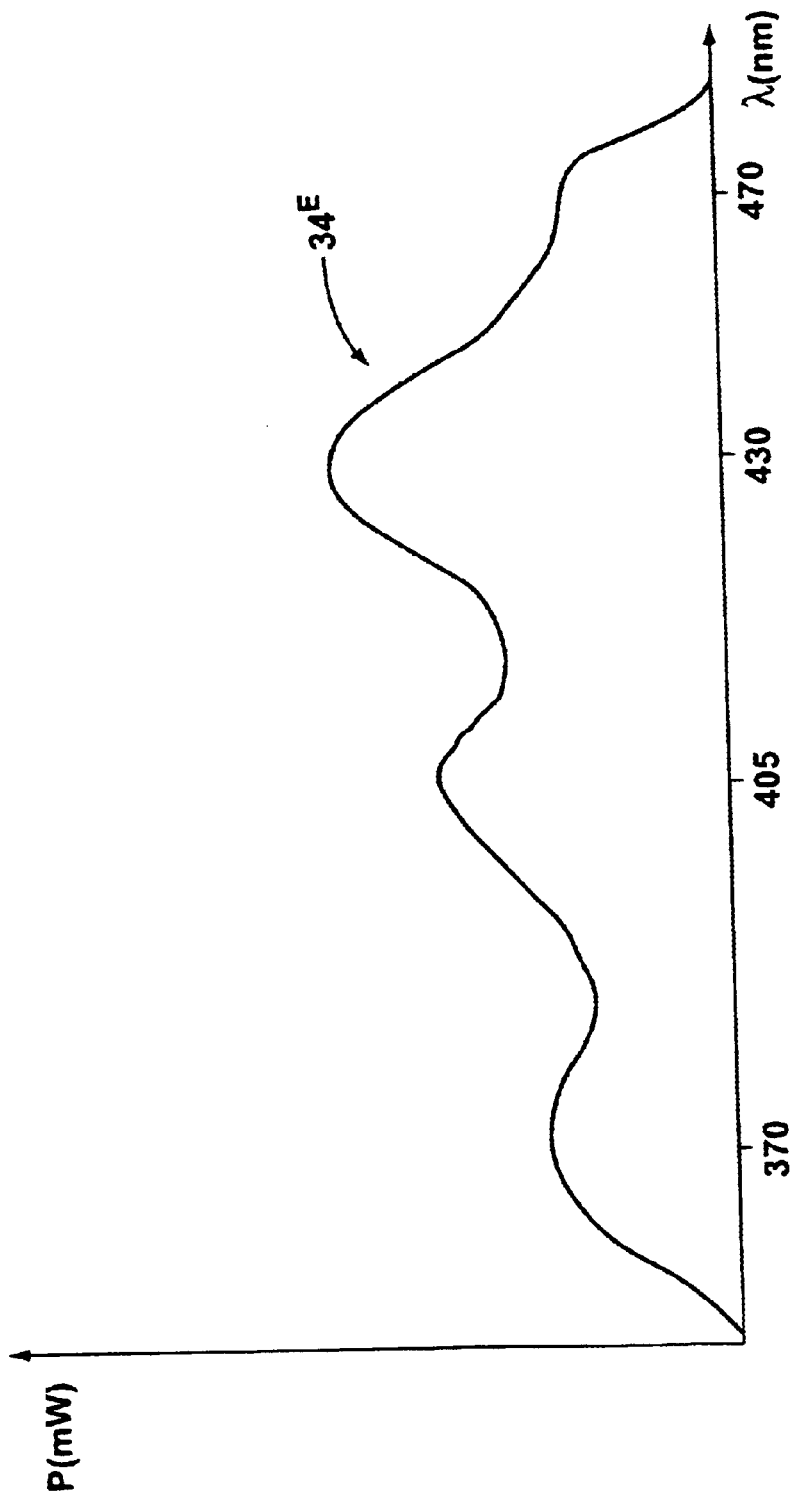
FIG. 2E is a chart indicating the additive light energy output of the LED die of FIG. 2D.

The continuous curve $34^E$ on the chart of FIG. 2E indicates the cumulative light energy output of the LED die $34^A$, $34^B$, $34^C$, $34^D$ of FIG. 2D. Accordingly, as should be understood, if the LED die 34 of an array 32 are selected in groups matching the output wavelengths of the LED die $34^A$, $34^B$, $34^C$, $34^D$, respectively, and if all such LED die 34 are energized to emit light energy simultaneously, the array 32 would function as a light source having a broad bandwidth.

In use, a user manipulates the device 10 such that the head assembly 14 is positioned proximate a workpiece intended to be irradiated with photoinitiating light energy. The user then inputs the curing parameters for the workpiece using the control data interface 24, which are stored by the controller 18. Such curing parameters may include the quantity of light energy required for the cure, or may simply include the desired power level and the duration of the cure period. If the LED die 34 in the array 32 are arranged in groups (of different types or configurations of LEDs), the control data interface 24 may include specific curing parameters including the timing and duration of a cure period for each group to be energized to emit light energy.

In accordance with the curing parameters, the controller 18 causes the power source to supply electrical energy to the array 32, causing the LED die 34 to emit light energy which is directed onto the workpiece. Throughout the curing period, the controller 18 monitors the temperature of the array 32 (as sensed by the temperature sensor 36), and controls the cooling system 22 to ensure that the temperature remains within acceptable parameters. Additionally, the controller 18 monitors the intensity of the light emitted by the array 32 (as sensed by the photo sensor 38) and adjusts the supply of power provided by the power source 20 as necessary to maintain the intensity within the curing parameters.

Figure 3:
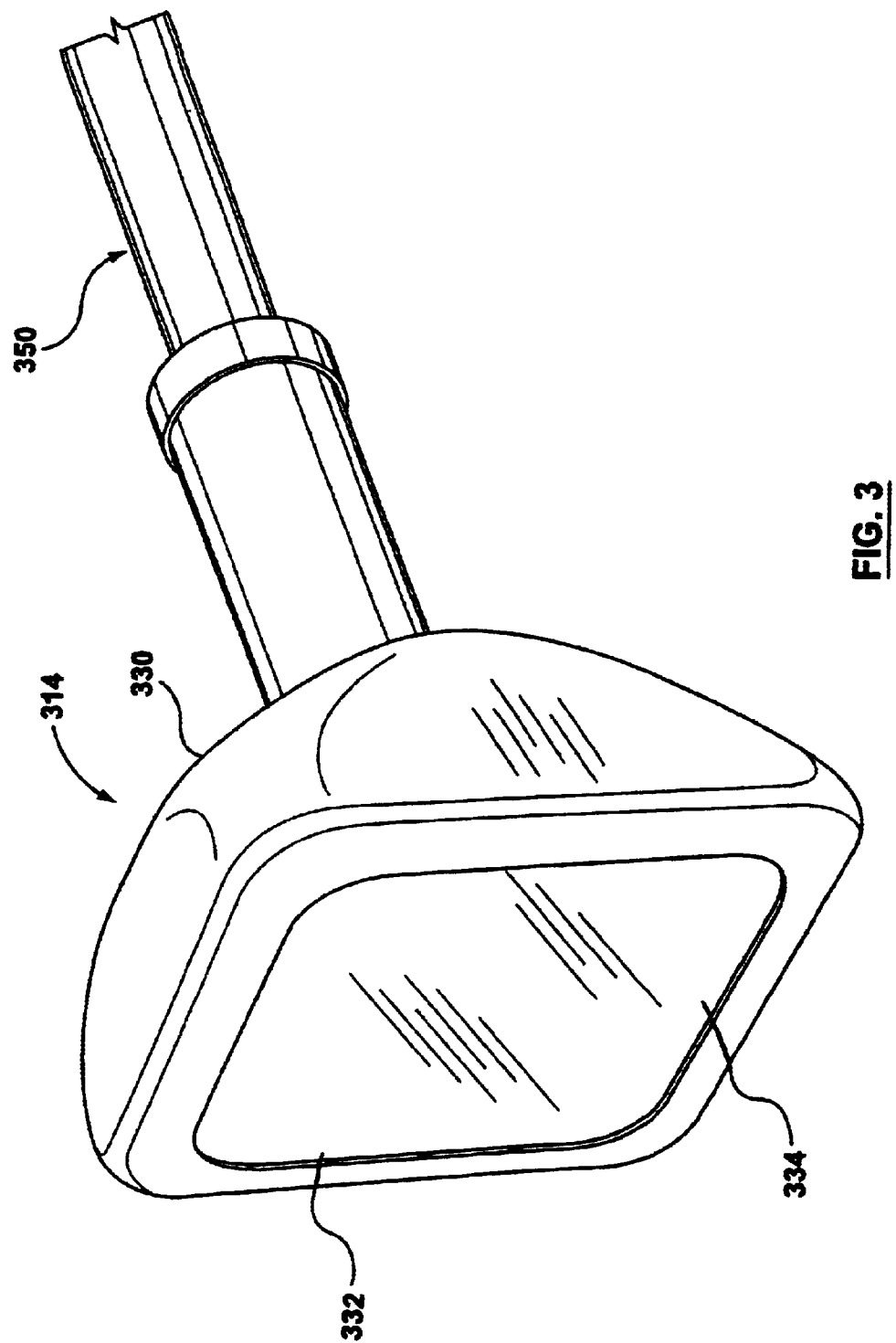
FIG. 3 is a front perspective view of a first alternate configuration of an LED array head assembly.

As shown in FIG. 3, illustrated therein is a second alternative embodiment of a head assembly 314 shown with a head assembly housing 330 enclosing an array 332 of LED die 334, with the connector 350 attached to the assembly 314. As should be understood, these components 330, 332, 334, 350 are generally similar to corresponding components 30, 32, 34, 50 illustrated in FIG. 1A.

Figure 4:
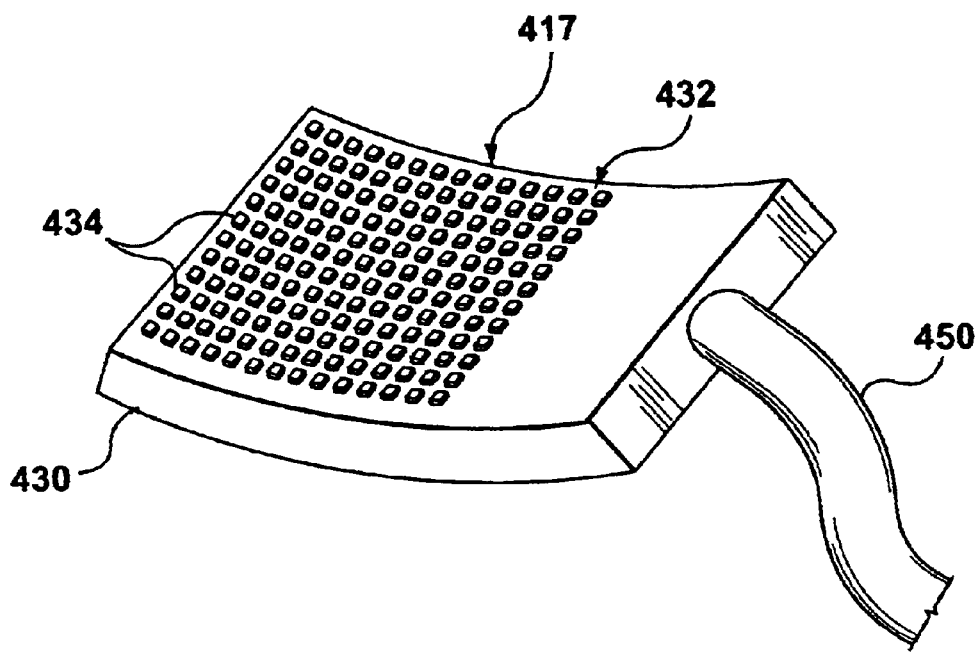
FIG. 4 is a top perspective view of a third alternative configuration of an LED array head assembly having a concave surface.

FIG. 4 illustrates a third alternative embodiment of a head assembly 414 with the connector 450 attached to the assembly 414. The assembly housing 430 as well as the array 432 are configured to form a concave surface where the LED die 434 are mounted. Typically, such a contoured configuration will be adopted to match the shape of the corresponding surface area portion of the workpiece to be cured. As will be understood, the head assembly 414 comprises a cooling system similar to that discussed in relation to FIG. 1B. As should also be understood, these components 430, 432, 434, 450 are generally similar to corresponding components 30, 32, 34, 50 illustrated in FIG. 1A.

Figure 5:
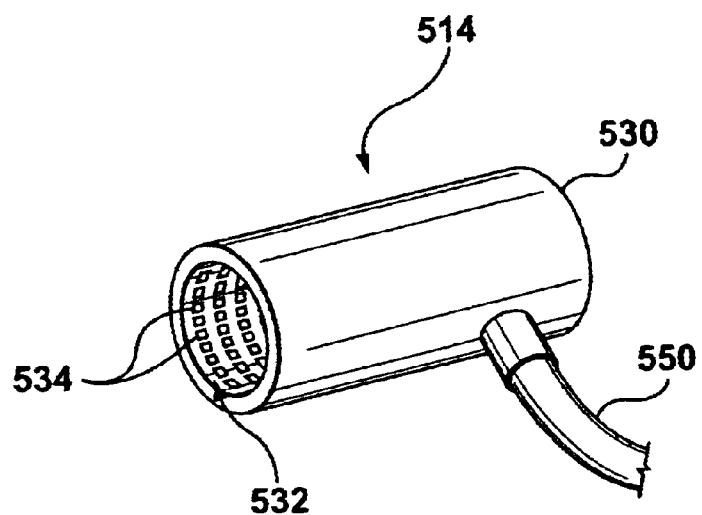
FIG. 5 is a top perspective view of a fourth alternative configuration of an LED array head assembly having a tubular configuration.

FIG. 5 illustrates a fourth alternative embodiment of a head assembly 514, with the connector 550 attached to the assembly 514. The housing 530 has a tubular configuration, in which the LED die 534 of the LED array 532 are positioned throughout the interior of the tube. With such a configuration, a workpiece to be cured may be inserted into the interior of the head assembly 514, for curing. As will be understood, such a configuration provides 360° of essentially uniform light emission (about the tube's longitudinal axis) within the tube. Alternatively, the array 532 may extend only partway around or cover only certain portions of the interior of the tube, depending on the requirements of the workpiece to be cured. As will also be understood, the head assembly 514 comprises a cooling system similar to that discussed in relation to FIG. 1B. As should further be understood, these components 530, 532, 534, 550 are generally similar to corresponding components 30, 32, 34, 50 illustrated in FIG. 1A.

Figure 6:
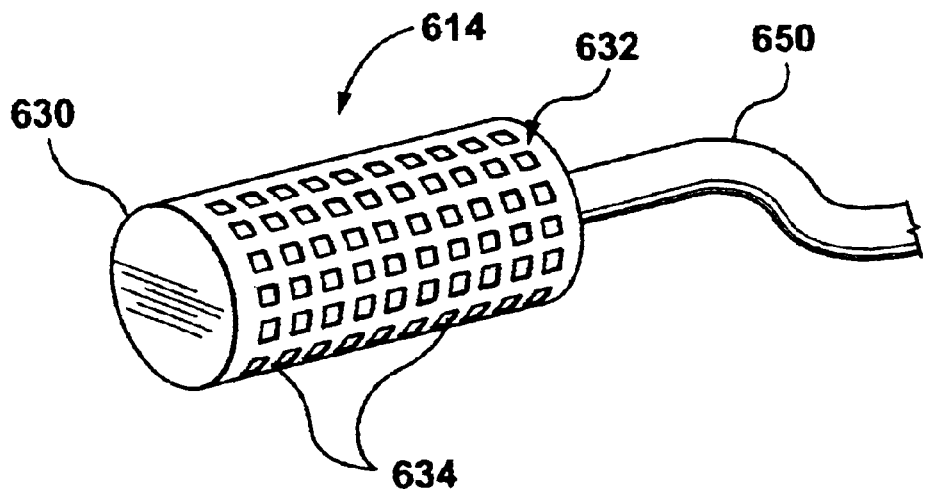
FIG. 6 is a top perspective view of a fifth alternative configuration of an LED array head assembly having a tubular configuration.

FIG. 6 illustrates a fifth alternative embodiment of a head assembly 614, with the connector 650 attached to the assembly 614. The housing 630 has a tubular configuration, in which the LED die 634 of the LED array 632 are positioned about the exterior of the tube. While the array 632 may extend around the entire periphery of the tube, alternatively, the array 632 may extend only partway around or cover only certain portions of the periphery, depending on the requirements of the workpiece to be cured. With such a configuration, the tubular head assembly 614 may be inserted into the interior of a workpiece, for internal curing. As will be understood, the head assembly 614 comprises a cooling system similar to that discussed in relation to FIG. 1B. As should further be understood, these components 630, 632, 634, 650 are generally similar to corresponding components 30, 32, 34, 50 illustrated in FIG. 1A.

Figure 7:
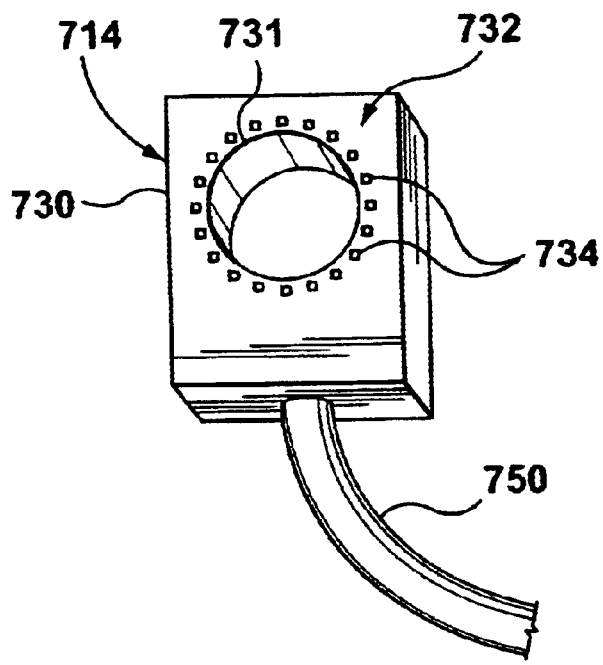
FIG. 7 is a top view of sixth alternative configuration of an array head assembly having LEDs configured in a shape approximating the periphery of a circle.

Referring now to FIG. 7, illustrated therein is a sixth alternative embodiment of an array head assembly 714 with the connector 750 attached to the assembly 714. The LED die 734 in the array 732 have been arranged in a shape approximating the periphery of a circle. Such a configuration may be selected when the portion of the workpiece to be cured is ring-shaped. The array head assembly 714 may be provided with a cylindrical hole 731 passing through the assembly housing 730, in the center of the LED die 734 circle. As will be understood, the head assembly 714 comprises a cooling system similar to that discussed in relation to FIG. 1B. As should further be understood, these components 730, 732, 734, 750 are generally similar to corresponding components 30, 32, 34, 50 illustrated in FIG. 1A.

Figure 8A:
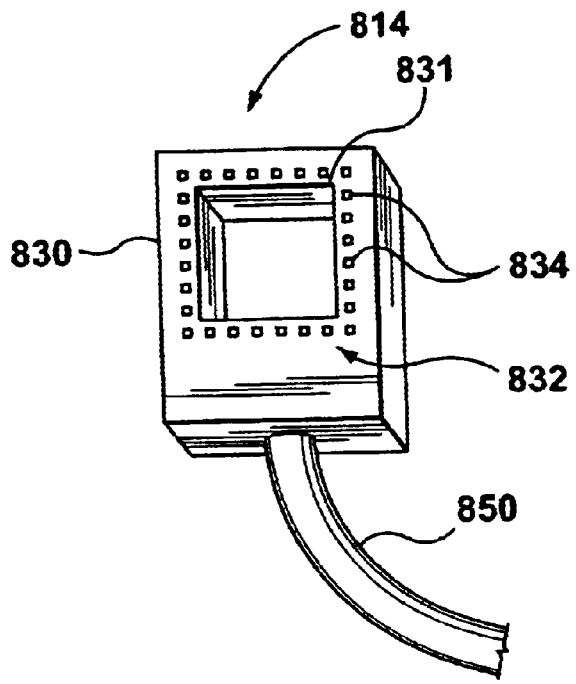
FIG. 8A is a top view of a seventh alternative configuration of an array head assembly having LEDs configured in a shape approximating the periphery of a square.

Referring now to FIG. 8A, illustrated therein is a view of a seventh alternative embodiment of an array head assembly 814, with the connector 850 attached to the assembly 814. The LED die 834 in the LED array 832 have been arranged in a shape approximating the periphery of a square. Such a configuration may be selected when the portion of the workpiece to be cured roughly matches such a shape. The array head assembly 814 may be provided with a square hole 831 passing through the assembly housing 830, in the center of the LED die 834 square. As will be understood, the head assembly 814 comprises a cooling system similar to that discussed in relation to FIG. 1B. As should further be understood, these components 830, 832, 834, 850 are generally similar to corresponding components 30, 32, 34, 50 illustrated in FIG. 1A.

Figure 8B:
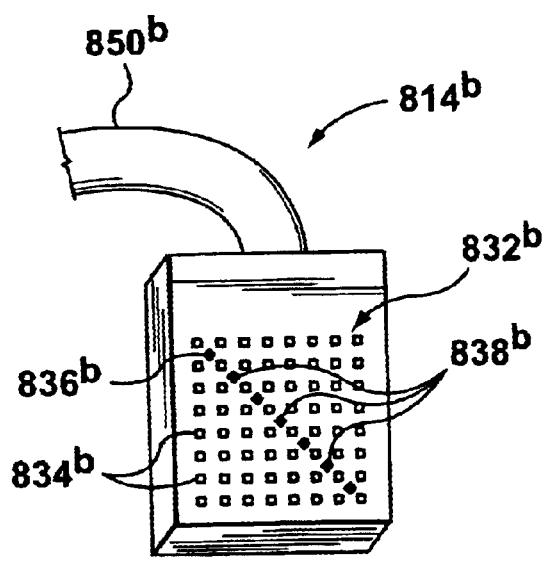
FIG. 8B is a top view of an eighth alternative configuration of an array head assembly having LEDs configured in a shape approximating a triangle.

Illustrated in FIG. 8B is a view of a eighth alternative embodiment of an array head assembly 814$^b$, with the connector 850$^b$ attached to the assembly 814$^b$. The LED die 834$^b$ in the LED array 832$^b$ have been arranged in a shape approximating a filled square. Also illustrated are a temperature sensor 836$^b$ and a plurality of photo detectors 838$^b$ positioned about the array 832$^b$. As will be understood, the head assembly 814$^b$ comprises a cooling system similar to that discussed in relation to FIG. 1B. As should further be understood, these components 830$^b$, 832$^b$, 834$^b$, 850$^b$ are generally similar to corresponding components 30, 32, 34, 50 illustrated in FIG. 1A.

As should be understood by the examples illustrated in FIGS. 4, 5, 6, 7 and 8A, the two and three dimensional shape of the LED array may be configured to approximate the surface area of the portion of the workpiece to be cured.

Figure 9:
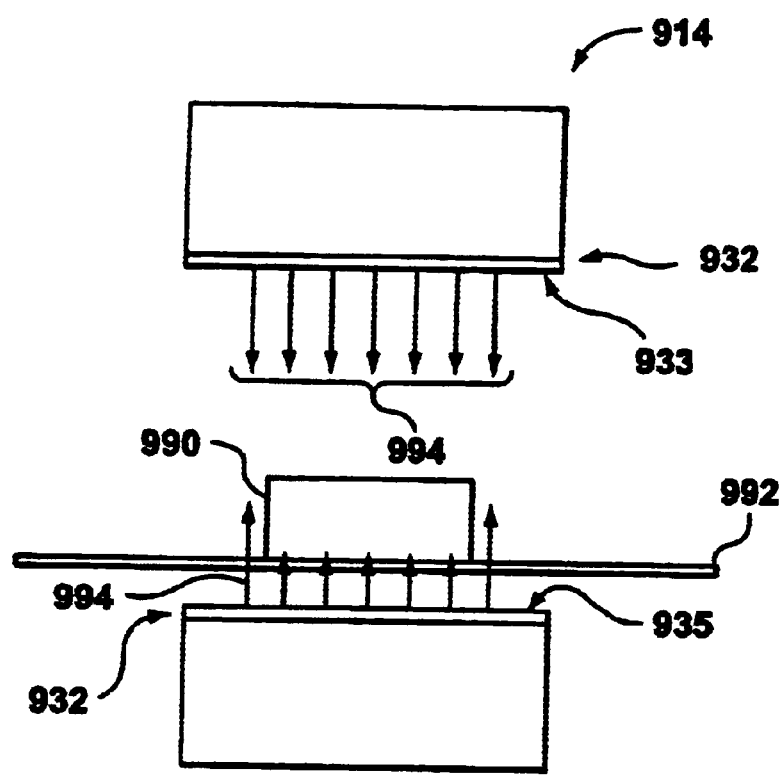
FIG. 9 is a side view of a ninth alternate configuration of an LED array head assembly having opposed arrays of LEDs.

FIG. 9 illustrates a side view of a ninth alternative embodiment of an array head assembly 914. In this embodiment, the array 932 comprises two planar arrays of LED die which oppose each other, an upper array 933 and a lower array 935. The arrays 933, 935 are capable of simultaneously irradiating two sides of a workpiece 990 passing between them. Preferably, a transparent table or conveyor 992 (or other device which enables the required wavelengths of light energy indicated by light rays 994 to pass through to the workpiece) may be used to carry the workpiece 990 between the arrays 933, 935. Alternately, the arrays may be positioned vertically on either side of the conveyor 992, such that no light energy is required to pass through the conveyor 992 in order to reach the workpiece. As should be understood, the arrays 933, 935 are both generally similar to the array assembly 14$^A$ discussed in relation to FIG. 2A.

Figure 10A:
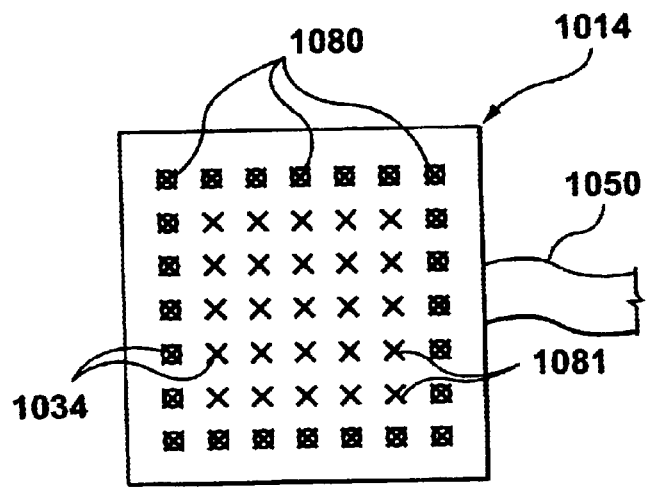
FIGS. 10A–10C show top views of a tenth alternate configuration of an LED array head assembly having an array of addressable LEDs.
Figure 10B:
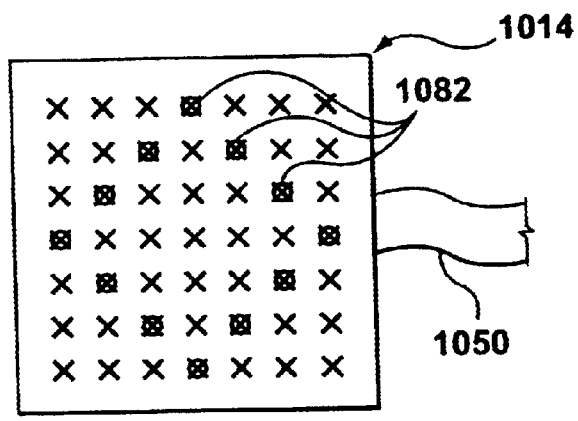
Figure 10C:
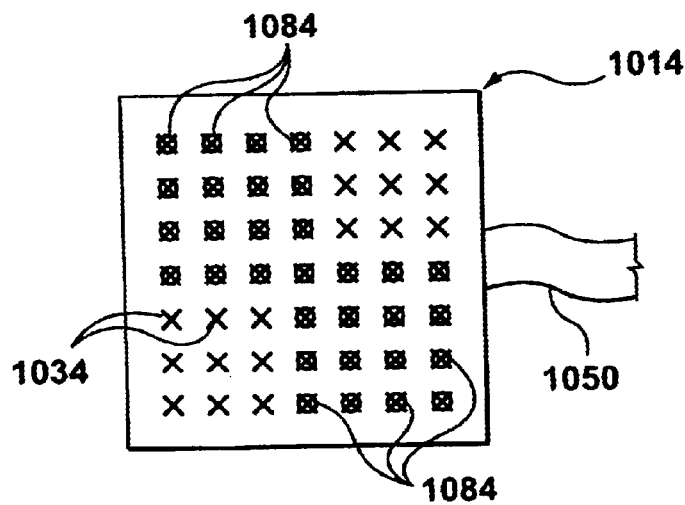

Referring now to FIGS. 10A–10C, illustrated therein is a tenth alternative embodiment of an array head assembly 1014, with the connector 1050 attached to the assembly 1014. The LED die 1034 in the LED array 1032 are addressable. Such addressability provides the ability to selectively supply power to groups of LED die 1034 and direct configurations of light onto the workpiece more precisely matching the surface area of the part of the workpiece to be cured. Additionally, as discussed in relation to FIG. 2D, the types or groups of LED die 1034 may be selected such that every LED die 1034 in a particular group emits light energy having substantially the same peak output wavelength as every other LED die 1034 in that group. Different groups of LED die 1034 would have different peak output wavelengths. Accordingly, as will be understood, addressability provides the ability to selectively supply power to different groups of LED die 34 having different peak output wavelengths, thereby generating light energy more precisely matching the curing requirements of the workpiece to be cured. As will be understood, the head assembly 1014 comprises a cooling system similar to that discussed in relation to FIG. 1B. As should further be understood, these components 1030, 1032, 1034, 1050 are generally similar to corresponding components 30, 32, 34, 50 illustrated in FIG. 1A.

As shown in FIG. 10A, the LED die 1080 addressed and energized to emit light energy form the periphery of a square. LED die 1081 are not energized to emit light energy. LED die 1080 may form a first group of LED die which all emit light energy having substantially the same peak output wavelength. The remaining LED die 1081 may form a second group of LED die which all emit light energy having substantially the same peak output wavelength, but which is different from the peak output wavelength of the first group of LED die 1080. As shown in FIG. 10B, the LEDs 1082 addressed and energized to emit light energy form the periphery of a square rotated 45 degrees from the square 1080 of FIG. 10A. As shown in FIG. 10C, the LEDs 1084 addressed and energized to emit light energy form two solid squares intersecting at one corner.

In an eleventh alternate embodiment of the head array assembly substantially similar to the array head assembly 1014, the LED die in the array may be grouped by alternating rows, such that odd rows of LED die would form one group, and even rows of LED die would form a second group. As will be understood, the power source and controller are configured to independently supply power to the first group and to the second group. The power supply is also configured to independently detect current flow from each group. Thus, when the first group of LED die is energized to emit light energy, sidewall emissions of light energy impinge upon the second group of LED die, generating a current proportional to the intensity of the impinging light energy, which is detected by the power source. The power supply then generates a signal to the controller correlated to the intensity of the detected light energy. Accordingly, the second group of LED die is capable of functioning as a photo sensor to detect the intensity of the first group of LED die. Similarly, the power source is also able to detect current generated by the first group of LED die, such that the first group of LED die can function as a photo sensor to detect the intensity of the second group of LED die.

Thus, while what is shown and described herein constitute preferred embodiments of the subject invention, it should be understood that various changes can be made without departing from the subject invention, the scope of which is defined in the appended claims.

We claim:

1. A light curing device comprising:
   (a) a housing;
   (b) a light emitting semiconductor array mounted to the housing, capable of emitting light energy having a light output wavelength suitable for initiating a photoreaction;
   (c) a power source for providing power to energize the array to emit light energy;
   (d) a controller coupled to the power source for varying the power provided by the power source to the array;
   (e) wherein the array comprises a plurality of light emitting semiconductors; and
   (f) wherein the plurality of semiconductors is grouped into a plurality of groups.

2. The light curing device as claimed in claim 1, wherein the array comprises at least one module of light emitting semiconductors.

3. The light curing device as claimed in claim 2, wherein the at least one module is removably mounted to the housing.

4. The light curing device as claimed in claim 1, wherein the array comprises a plurality of light emitting diodes.

5. The light curing device as claimed in claim 1, wherein the semiconductor array comprises at least one laser diode.

6. The light curing device as claimed in claim 1, wherein the array comprises a plurality of laser diodes.

7. The light curing device as claimed in claim 1, wherein the array comprises at least one reflector positioned proximate at least one light emitting semiconductor to reflect a sidewall emission of light energy from said light emitting semiconductor.

8. The light curing device as claimed in claim 1, wherein the controller also comprises control data interface means for inputting data correlated to a desired power level, and wherein the controller adjusts the power provided by the power source to the semiconductor array to approximate the desired power level.

9. The light curing device as claimed in claim 1, wherein the controller also comprises control data interface means for inputting data correlated to curing parameters, and wherein the controller adjusts the power provided by the power source to the semiconductor array in accordance with the curing parameters.

10. The light curing device as claimed in claim 1, wherein every semiconductor in a group emits light energy having substantially the same peak light output wavelength as every other semiconductor in said group.

11. The light curing device as claimed in claim 10, wherein every semiconductor in a group emits light energy having a substantially different peak light output wavelength than the peak light output wavelength of light emitted by the semiconductors in every other group.

12. The light curing device as claimed in claim 1, wherein the semiconductors in a group are positioned in the array to form a shape approximating the surface area of a portion of a workpiece to be cured.

13. The light curing device as claimed in claim 1, wherein the controller is adapted to vary the level of power supplied to at least one group.

14. The light curing device as claimed in claim 1, wherein the controller is adapted to separately vary the level of power supplied to at least one group over time.

15. The light curing device as claimed in claim 1, wherein the controller also comprises control data interface means for inputting data correlated to a desired power level for at least one group, and wherein the controller adjusts the power provided by the power source to each said at least one group of semiconductors to approximate the desired power level for that group.

16. The light curing device as claimed in claim 1, wherein the housing comprises a main body housing and an array housing, and wherein the array is mounted to the array housing.

17. The light curing device as claimed in claim 1, further comprising a cooling system for cooling the array, wherein the cooling system is operationally coupled to the power source.

18. The light curing device as claimed in claim 17, wherein the controller is adapted to vary the power supplied to the cooling system.

19. The light curing device as claimed in claim 17, wherein the cooling system comprises at least one selected from the following set of: liquid cooled heat sink, fan, thermoelectric cooler, cold plate and heat exchanger.

20. The light curing device as claimed in claim 1, further comprising at least one photo sensor operatively coupled to the controller, wherein the photo sensor is adapted to detect the energy level of light emitted by the array.

21. The light curing device as claimed in claim 20, further comprising an output window positioned above the array, and wherein the output window comprises a transparent material such that a substantial portion of the light emitted by the array passes through the output window.

22. The light curing device as claimed in claim 21, wherein the transparent material is selected such that some of the light emitted by the array is internally reflected within the output window.

23. The light curing device as claimed in claim 22, wherein the photo sensor is positioned proximate the output window such that the photo sensor detects the energy level of the light which is internally reflected within the output window.

24. The light curing device as claimed in claim 20, wherein the photo sensor comprises at least one fiber optic cable positioned within the array and adapted to receive some light energy emitted by the array.

25. The light curing device as claimed in claim 20, wherein the photo sensor comprises at least one light emitting semiconductor which is not energized to emit light energy, wherein the power source is adapted to detect current flow generated by said at least one light emitting semiconductor when the array is energized to emit light energy.

26. The use of the light curing device as claimed in claim 1 to photocure photoreactive materials.

27. The apparatus as claimed in claim 1, wherein the array is configured in shape.

28. The apparatus as claimed in claim 1, wherein the array is configured in a two dimensional shape approximating the shape of a portion of a workpiece to be cured.

29. The apparatus as claimed in claim 28, wherein the array is configured in a three dimensional shape approximating the surface area of a portion of a workpiece to be cured.

30. The apparatus as claimed in claim 1, wherein the array is configured to emit light energy having a broad bandwidth.

31. A light curing device comprising:
   (a) a housing;
   (b) a light emitting semiconductor array mounted to the housing, capable of emitting light energy having a light output wavelength suitable for initiating a photoreaction;

(c) a power source for providing power to energize the array to emit light energy;

(d) a controller coupled to the power source for varying the power provided by the power source to the array;

(e) wherein the array comprises a plurality of light emitting semiconductors; and (f) wherein at least one semiconductor is addressable, and wherein the controller is adapted to vary the level of power supplied to said at least one addressable semiconductor.

32. The method of photocuring a photoreactive product, comprising the steps of:

(a) providing a light curing device comprising a plurality of semiconductors capable of emitting light energy suitable for initiating a photoreaction;

(b) positioning a photoreactive product proximate the light curing device; and (c) selecting a plurality of semiconductors; and (d) causing the selected plurality of semiconductors to emit light energy suitable for initiating a photoreaction onto the product.

33. The method as claimed in claim 32, wherein step (d) comprises sensing the energy level of the emitted light energy.

34. The method as claimed in claim 33, wherein steps (c) and (d) are repeated with a different selected plurality of addressable semiconductors.

* * * * *